(12) United States Patent
Nakamura

(10) Patent No.: US 12,126,215 B2
(45) Date of Patent: Oct. 22, 2024

(54) UNINTERRUPTIBLE POWER SUPPLY DEVICE

(71) Applicant: TMEIC Corporation, Chuo-ku (JP)

(72) Inventor: Koki Nakamura, Chuo-ku (JP)

(73) Assignee: TMEIC Corporation, Chuo-ku (JP)

( * ) Notice: Subject to any disclaimer, the term of this patent is extended or adjusted under 35 U.S.C. 154(b) by 122 days.

(21) Appl. No.: 17/995,668

(22) PCT Filed: Dec. 1, 2020

(86) PCT No.: PCT/JP2020/044666
§ 371 (c)(1),
(2) Date: Oct. 6, 2022

(87) PCT Pub. No.: WO2022/118371
PCT Pub. Date: Jun. 9, 2022

(65) Prior Publication Data
US 2023/0198291 A1    Jun. 22, 2023

(51) Int. Cl.
*H02J 9/06* (2006.01)
*H02B 1/30* (2006.01)
*H02B 1/56* (2006.01)
*H02J 3/32* (2006.01)
*H02J 3/38* (2006.01)

(52) U.S. Cl.
CPC ............ *H02J 9/062* (2013.01); *H02B 1/30* (2013.01); *H02B 1/565* (2013.01); *H02J 3/32* (2013.01); *H02J 3/38* (2013.01)

(58) Field of Classification Search
CPC .... G06F 1/189; H05K 7/1457; H05K 7/1492; H02B 1/30; H02B 1/305; H02B 1/56; H02B 1/565; H02J 9/062; H02J 3/32; H02J 3/38
See application file for complete search history.

(56) References Cited

U.S. PATENT DOCUMENTS

| | | | |
|---|---|---|---|
| 6,882,530 B2* | 4/2005 | Cyphers | H05K 7/1457 361/600 |
| 7,379,305 B2* | 5/2008 | Briggs | H05K 7/18 361/727 |
| 7,948,207 B2* | 5/2011 | Scheucher | H02J 3/322 324/427 |
| 8,026,698 B2* | 9/2011 | Scheucher | H01M 10/482 320/136 |

(Continued)

FOREIGN PATENT DOCUMENTS

| | | | | |
|---|---|---|---|---|
| CN | 218632926 U | * | 3/2023 | |
| CN | 116868476 A | * | 10/2023 | ........... H02J 9/06 |

(Continued)

OTHER PUBLICATIONS

Japanese Office Action issued Jun. 21, 2022 in Japanese Patent Application No. 2021-543416 (with unedited computer-generated English translation), 8 pages.

(Continued)

*Primary Examiner* — Robert J Hoffberg
(74) *Attorney, Agent, or Firm* — Oblon, McClelland, Maier & Neustadt, L.L.P.

(57) ABSTRACT

An uninterruptible power supply device includes a housing having a rectangular parallelepiped shape, a plurality of units vertically stacked and accommodated in housing, and a fan unit having a plurality of fans aligned on an upper surface of housing. Each of the upper surface and the lower surface of housing is formed with an opening through which a wire is led into housing.

6 Claims, 8 Drawing Sheets

(56) References Cited

U.S. PATENT DOCUMENTS

| | | | | |
|---|---|---|---|---|
| 8,162,417 | B2* | 4/2012 | Briggs | H05K 7/1424 |
| | | | | 312/334.4 |
| 8,854,824 | B2* | 10/2014 | Briggs | H05K 5/0247 |
| | | | | 361/727 |
| 8,872,474 | B2* | 10/2014 | Scheucher | B60L 53/11 |
| | | | | 320/112 |
| 9,713,280 | B2* | 7/2017 | Lai | H02J 3/1842 |
| 10,109,888 | B2* | 10/2018 | Scheucher | H01M 10/425 |
| 10,389,120 | B2* | 8/2019 | Ohnishi | H02J 9/062 |
| 10,454,254 | B2* | 10/2019 | Kin | H02J 9/062 |
| 2023/0337404 | A1* | 10/2023 | Nakamura | H05K 7/20172 |
| 2023/0411990 | A1* | 12/2023 | Nakamura | H02M 5/45 |
| 2024/0064942 | A1* | 2/2024 | Shigeta | H02J 9/06 |

FOREIGN PATENT DOCUMENTS

| | | |
|---|---|---|
| JP | 2010-098865 A | 4/2010 |
| JP | 2014-072214 A | 4/2014 |
| JP | 2015-162485 A | 9/2015 |
| JP | 2018-170076 A | 11/2018 |
| KR | 10-1033846 B | 5/2011 |
| KR | 10-1981771 B1 | 5/2019 |

OTHER PUBLICATIONS

Written Opinion of the International Searching Authority issued Feb. 16, 2021 in PCT/JP2020/044666 (with unedited computer-generated English translation), 8 pages.

Korean Office Action dated Mar. 27, 2024 in corresponding Korean Application No. 10-2022-7034023 (with English translation), 8 pages.

International Search Report issued Feb. 16, 2021 in PCT/JP2020/044666 filed on Dec. 1, 2020, 2 pages.

Office Action dated Aug. 9, 2024, issued in counterpart IN Application No. 202217056875, with English Translation, (5 pages).

* cited by examiner

UNINTERRUPTIBLE POWER SUPPLY DEVICE

TECHNICAL FIELD

The present invention relates to an uninterruptible power supply device.

BACKGROUND ART

Japanese Patent Laying-Open No. 2010-98865 (PTL 1) discloses a power converter board including a plurality of functional units housed in a cubicle-shaped board body. The plurality of functional units is stacked in the vertical direction and placed in the board body. An extraction opening for extracting a connection line (power line, control line) to the outside is formed in a ceiling plate of the board body. A wiring space through which the connection line passes is formed between the functional units in the board body and a side plate of the board body.

CITATION LIST

Patent Literature

PTL 1: Japanese Patent Laying-Open No. 2010-98865

SUMMARY OF INVENTION

Technical Problem

In the power converter disclosed in PTL 1, a wire can be led into the board body from the ceiling plate of the board body, but the wire cannot be led into the board body from the bottom plate of the board body. A wire entry board may be optionally provided separately from the board body in order to lead the wire into the board body from the bottom plate. With this configuration, it is possible to connect the wire to a terminal through the wire entry board. However, in this configuration, the wire entry board is attached to the board body, so that the power converter may be undesirably complicated and increased in size.

Alternatively, as a configuration different from the configuration using the wire entry board, there can be a configuration provided with, on a rear surface of the board body, a terminal which can respond to entry of a wire from both the upper surface and the lower surface, or a configuration provided with, on a side surface of the board body, a wiring space which can respond to entry of wire from the upper surface and the lower surface as disclosed in Patent Literature 1. However, the configuration provided with a terminal on the rear surface needs to ensure a space for wiring on the rear surface of the board body. The configuration provided with a wiring space needs to increase the size of the wiring space with an increase in the number of wires and the wire diameter. As a result, both configurations have a problem of an increase in the installation area of the power converter.

The present invention has been accomplished to address the foregoing problem, and an object thereof is to provide an uninterruptible power supply device that enables entry of a wire from both an upper surface and a lower surface of a housing with a simple and compact configuration.

Solution to Problem

According to an aspect of the present invention, an uninterruptible power supply device includes a housing having a rectangular parallelepiped shape, a plurality of units vertically stacked and accommodated in the housing, and a fan unit having a plurality of fans aligned on an upper surface of the housing. Each of the upper surface and the lower surface of the housing is formed with an opening through which a wire is led into the housing.

Advantageous Effects of Invention

The present invention can provide an uninterruptible power supply device that enables entry of a wire from both the upper surface and the lower surface of the housing with a simple and compact configuration.

BRIEF DESCRIPTION OF DRAWINGS

FIG. 2 is a rear view of the uninterruptible power supply device illustrated in

FIG. 1 as viewed from rear.

DESCRIPTION OF EMBODIMENTS

Figure 1:
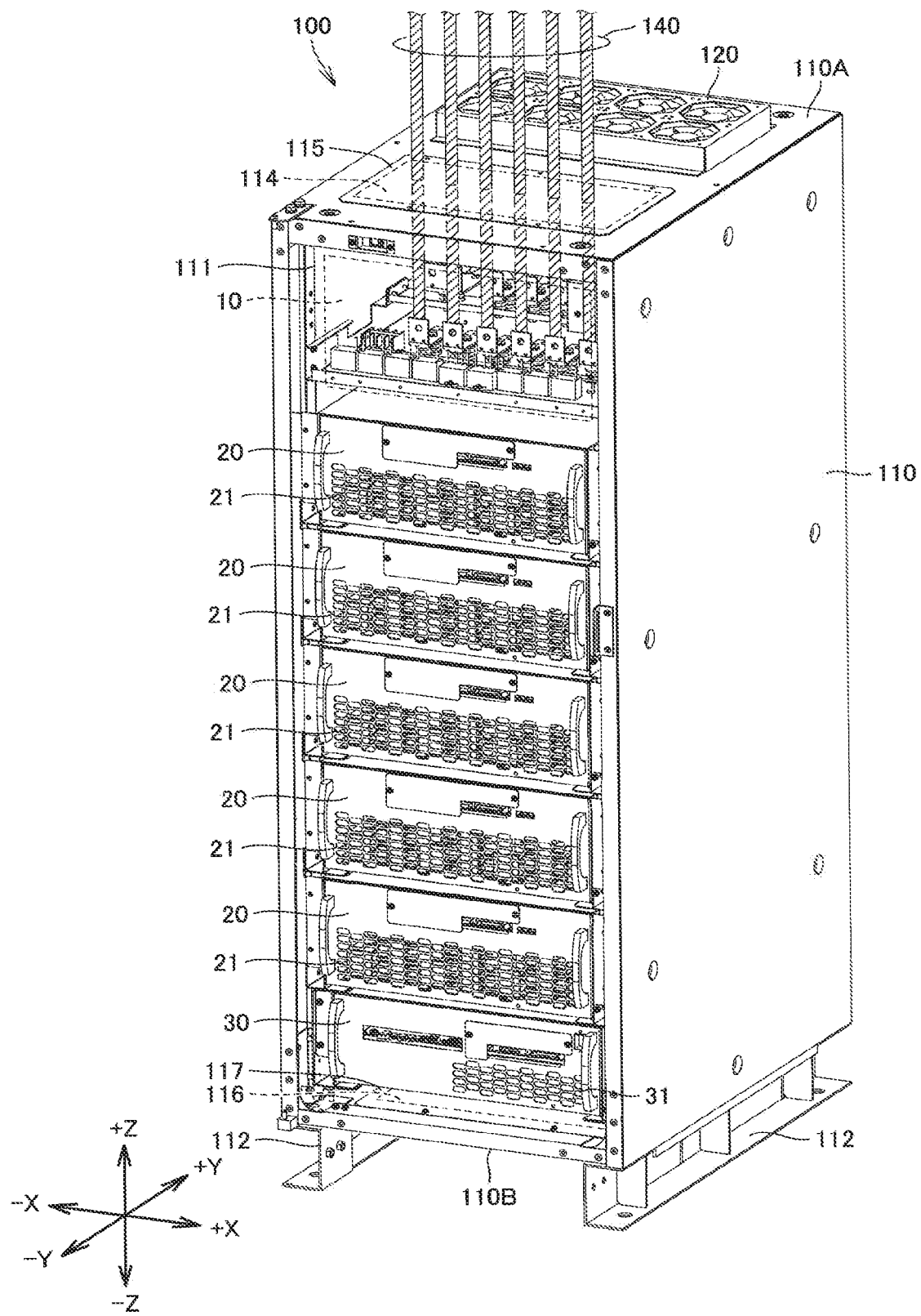
FIG. 1 is a schematic external view illustrating a configuration example of an uninterruptible power supply device according to an embodiment of the present invention.

Embodiments of the present invention will be described below in detail with reference to the drawings. The same or corresponding parts in the drawings are denoted by the same reference signs, and the description thereof will not be repeated.

Figure 2:
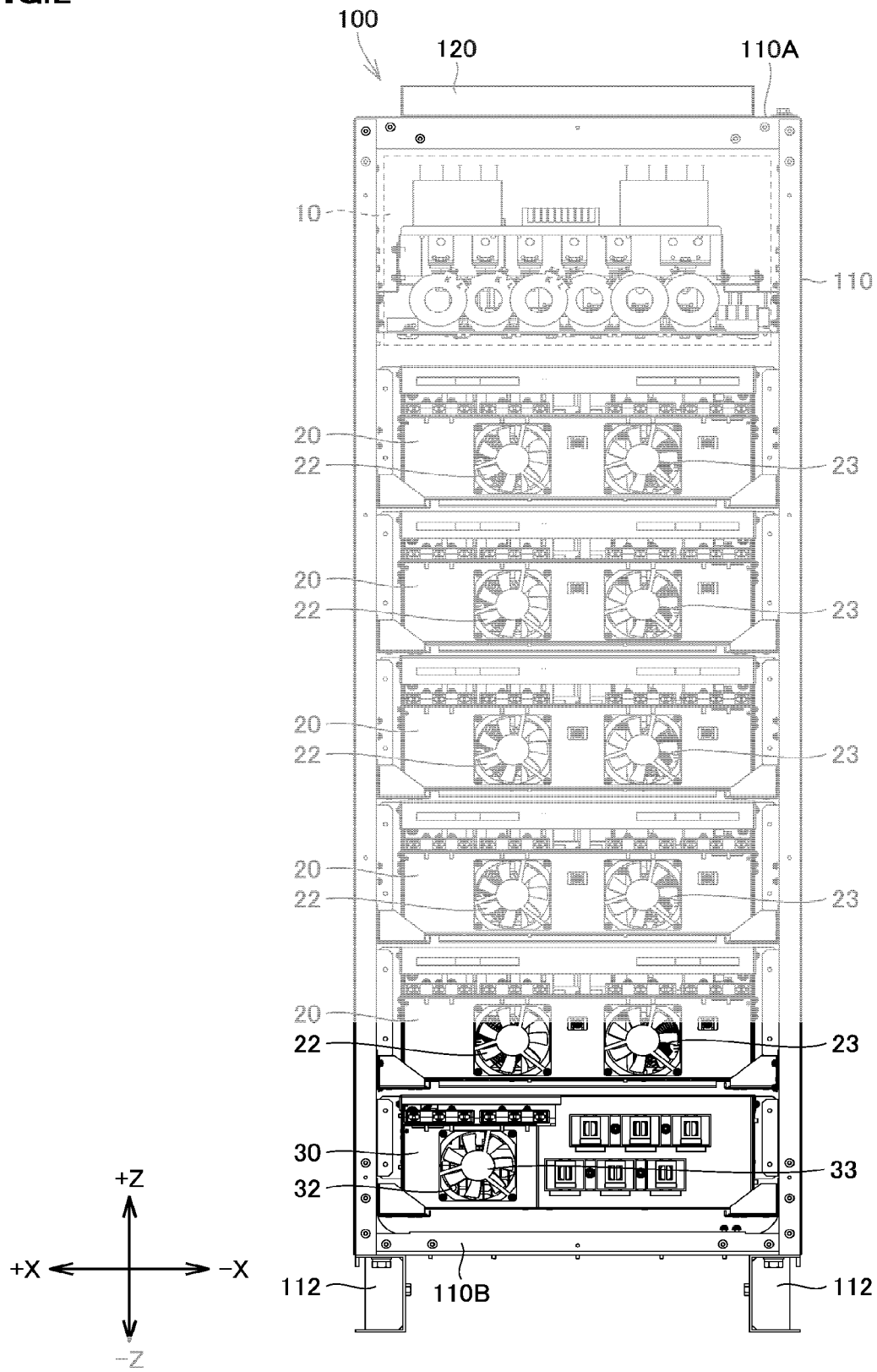

FIG. 1 is a schematic external view illustrating a configuration example of an uninterruptible power supply device according to an embodiment. FIG. 2 is a rear view of the uninterruptible power supply device illustrated in FIG. 1 as viewed from rear. FIG. 2 illustrates an internal configuration of the uninterruptible power supply device from which a rear cover is removed.

An uninterruptible power supply device 100 according to the present embodiment supplies electric power to a load (not illustrated) by alternating-current (AC) power supplied from an AC power supply such as a commercial power supply in an ordinary state (normal state). When the AC power supply fails, uninterruptible power supply device 100 supplies electric power to the load by direct-current (DC) power supplied from an electrical storage device (not shown).

As illustrated in FIG. 1, uninterruptible power supply device 100 includes a cabinet-shaped (cuboid) housing 110, a plurality of units 10, 20, and 30, and a fan unit 120. In the following description, the horizontal direction when housing 110 is viewed from the front side is defined as an X-axis direction, the front-rear direction is defined as a Y-axis direction, and the vertical direction is defined as a Z-axis direction. Note that the +X direction is a direction pointing to the right along the X-axis direction, and the −X direction is a direction opposite to the +X direction. The +Y direction is a direction from the front surface to the rear surface of uninterruptible power supply device 100, and the −Y direction is a direction opposite to the +Y direction. The +Z direction is a direction pointing upward along the Z-axis direction, and the −Z direction is a direction opposite to the +Z direction.

Housing 110 has an upper surface 110A and a lower surface 110B. Lower surface 110B of housing 110 is supported by a pair of legs 112. Housing 110 houses the plurality of units 10, 20, and 30. Housing 110 includes an opening 111 that opens in the −Y direction and a front cover (not illustrated) that covers opening 111. The front cover is provided to open and close opening 111. The front cover is formed with a vent hole for introducing air outside housing 110 into housing 110.

The plurality of units 10, 20, and 30 has a substantially rectangular parallelepiped shape, and is stacked at intervals in the Z-axis direction. The plurality of units 10, 20, and 30 is inserted into housing 110 from the outside of housing 110 through opening 111. Each of the plurality of units 10, 20, and 30 is insertable and removable in the Y-axis direction so as to facilitate maintenance check and replacement with a new one.

The plurality of units 10, 20, and 30 includes a terminal unit 10, a plurality of uninterruptible power supply (UPS) units 20, and a bypass unit 30. Terminal unit 10 accommodates a plurality of terminals for connecting the plurality of UPS units 20 and bypass unit 30 in parallel between the AC power supply and the load. Terminal unit 10 is disposed above the plurality of UPS units 20 and bypass unit 30. UPS units 20 correspond to an example of an "uninterruptible power supply unit". The number of UPS units 20 is not limited to five. The number of bypass units 30 is not limited to one.

A vent 21 is formed in the front surface of each of UPS units 20, and a vent 22 is formed on the rear surface thereof. Each UPS unit 20 has incorporated therein a fan 23 for air intake from the front surface and air discharge from the rear surface. A vent 31 is formed in the front surface of bypass unit 30, and a vent 32 is formed on the rear surface thereof. Bypass unit 30 has incorporated therein a fan 33 for air intake from the front surface and air discharge from the rear surface. The configurations of UPS units 20 and bypass unit 30 will be described later. The number of fans incorporated in each unit is not limited.

Fan unit 120 is disposed on upper surface 110A of housing 110. Fan unit 120 sucks air inside housing 110 and discharges the sucked air to the outside of housing 110. As a result, air is introduced into housing 110 through a ventilation hole of the front cover of housing 110, and the introduced air passes through the plurality of units 20 and 30, thereby promoting heat dissipation of the plurality of units 20 and 30. The air heated by passing through the plurality of units 20 and 30 is discharged to the outside of housing 110.

Fan unit 120 includes a plurality of fans. The plurality of fans is aligned on upper surface 110A of housing 110. In the example of FIG. 1, fan unit 120 has eight fans, but the number of fans is not limited to eight.

Upper surface 110A of housing 110 also has an opening 114. Opening 114 is used as an entry port through which a wire 140 is led into housing 110. A first end of wire 140 is connected to the terminal accommodated in terminal unit 10 inside housing 110. Although not illustrated, a second end of wire 140 is connected to the AC power supply, the load, the electrical storage device, or the like.

Opening 114 is covered with a lid 115. Wire 140 is led into housing 110 through a through hole formed in lid 115. Note that, in order to prevent intrusion of dust into housing 110, the through hole is closed by resin or the like in a state where wire 140 penetrates the through hole.

An opening 116 is also formed in lower surface 110B of housing 110. Similar to opening 114, opening 116 is used as an entry port through which wire 140 is led into housing 110. Opening 116 is covered with a lid 117.

In uninterruptible power supply device 100 according to the present embodiment, openings 114 and 116 through which wire 140 is led into housing 110 are formed in upper surface 110A and lower surface 110B of housing 110, respectively. This configuration can respond to both situations where wire 140 is led from upper surface 110A of housing 110 and where wire 140 is led from lower surface 110B of housing 110.

FIG. 1 illustrates a configuration example in a case where wire 140 is led from upper surface 110A of housing 110. In this case, terminal unit 10 is located at the uppermost stage (the side closest to opening 114) among the plurality of units 10, 20, and 30. Therefore, connection between wire 140 and the terminal can be simplified. Such an arrangement can be achieved by dividing components constituting uninterruptible power supply device 100 for each function into units.

Figure 3:
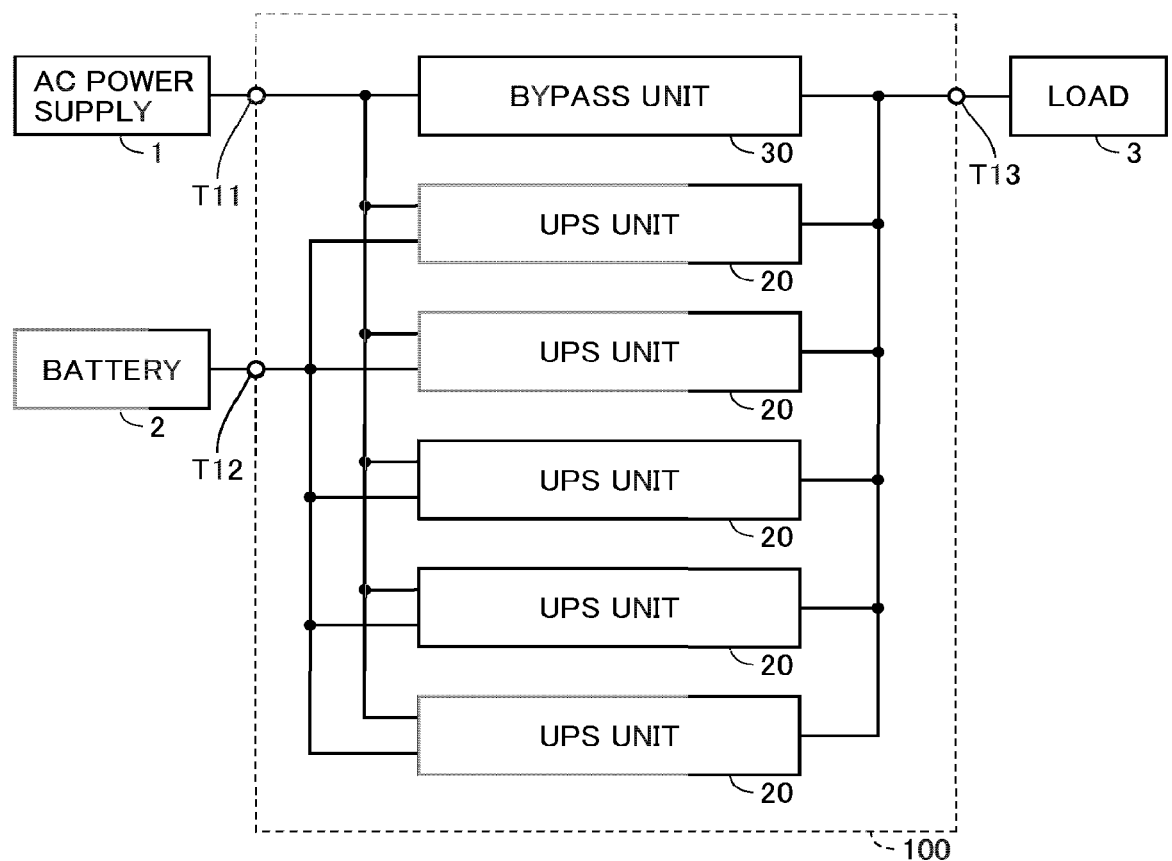
FIG. 3 is a circuit block diagram showing the configuration of the uninterruptible power supply device.

FIG. 3 is a circuit block diagram showing the configuration of uninterruptible power supply device 100.

As illustrated in FIG. 3, uninterruptible power supply device 100 includes an input terminal T11, a battery terminal T12, an output terminal T13, a plurality of UPS units 20, and bypass unit 30. Input terminal T11 is connected to an AC power supply 1 and receives AC power of a commercial AC frequency. Output terminal T13 is connected to a load 3. Battery terminal T12 is connected to a battery 2. Battery 2 corresponds to an example of an "electrical storage device". The plurality of UPS units 20 and bypass unit 30 are connected in parallel between input terminal T11 and output terminal T13. Input terminal T11, output terminal T13, and battery terminal T12 are accommodated in terminal unit 10.

Figure 4:
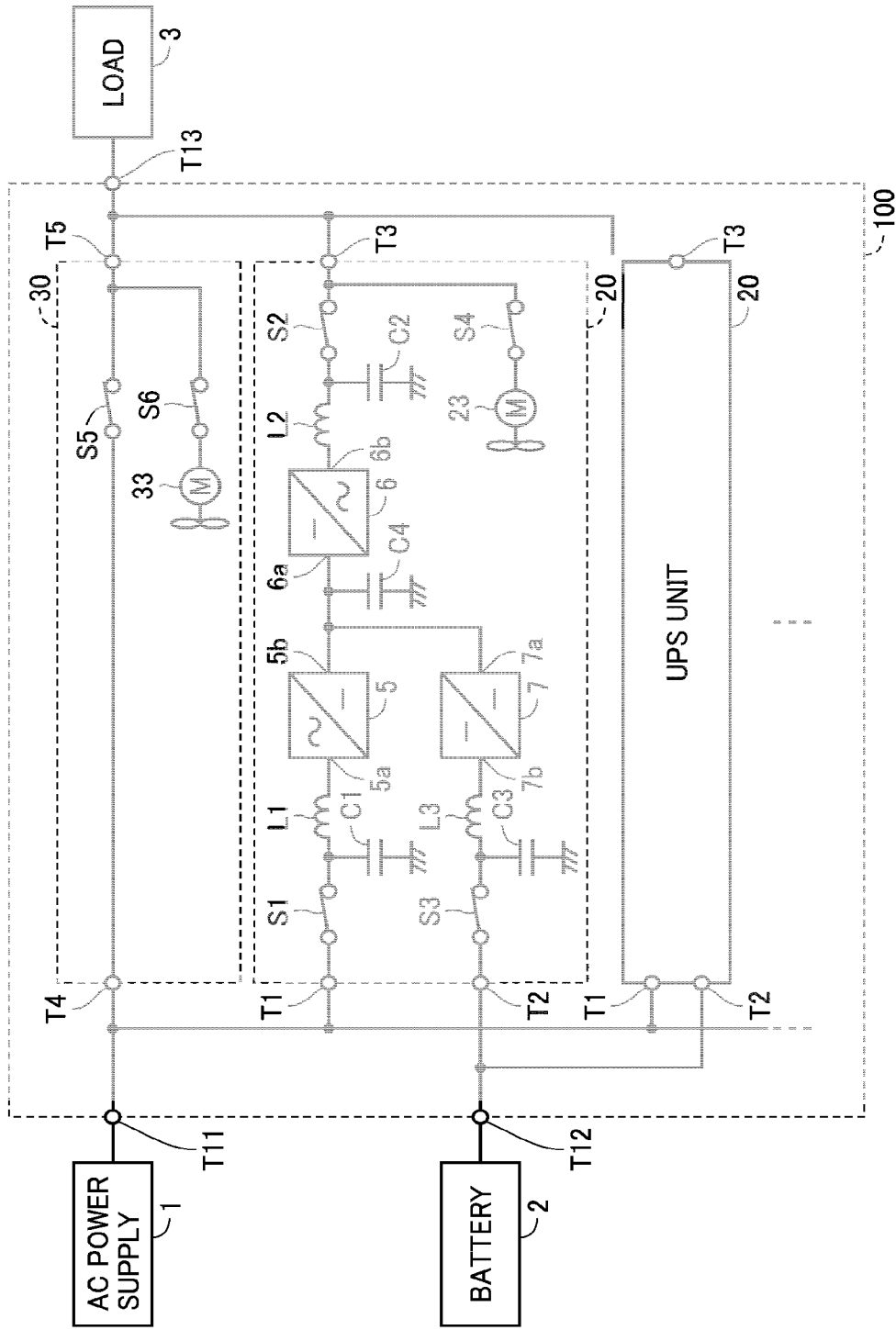
FIG. 4 is a circuit block diagram illustrating a configuration example of a UPS unit and a bypass unit.

FIG. 4 is a circuit block diagram illustrating a configuration example of UPS unit 20 and bypass unit 30.

As illustrated in FIG. 4, UPS unit 20 includes an input terminal T1, an output terminal T3, a battery terminal T2, switches S1 to S4, capacitors C1 to C4, reactors L1 to L3, a converter 5, an inverter 6, a bidirectional chopper 7, and fan 23.

Terminals T1, T2, and T3 are connected to terminals T11, T12, and T13, respectively. Switch S1 and reactor L1 are connected in series between input terminal T1 and an input node 5a of converter 5. Capacitor C1 is connected between a node between switch S1 and reactor L1 and a reference voltage line. Switch S1 is normally turned on, and is turned off, for example, at the time of maintenance of UPS unit 20. Capacitor C1 and reactor L1 constitute an AC input filter (low-pass filter) that passes AC power from AC power supply 1 to converter 5 and suppresses leakage of a signal of a carrier frequency generated in converter 5 to an AC power supply 1 side.

Converter 5 converts AC power from AC power supply 1 into DC power. Capacitor C4 is connected between an output node 5b of converter 5 and the reference voltage line, and smooths the output voltage of converter 5. Output node 5b of converter 5, an input node 6a of inverter 6, and a first node 7a of bidirectional chopper 7 are connected to each other. Inverter 6 converts DC power from converter 5 or bidirectional chopper 7 into AC power of a commercial frequency.

Reactor L2 and switch S2 are connected in series between an output node 6b of inverter 6 and output terminal T3. Capacitor C2 is connected between a node between reactor L2 and switch S2 and the reference voltage line. Reactor L2 and capacitor C2 constitute an AC output filter (low-pass filter) that passes AC power from inverter 6 to load 3 and suppresses leakage of a signal of a carrier frequency generated in inverter 6 to a load 3 side.

Switch S2 is turned on in an inverter power supply mode in which the AC power generated by inverter 6 is supplied to load 3, and is turned off in a bypass power supply mode in which the AC power from AC power supply 1 is supplied to load 3 via bypass unit 30. In addition, switch S2 is turned off at the time of maintenance or failure of UPS unit 20.

Switch S3 and reactor L3 are connected in series between battery terminal T2 and a second node 7b of bidirectional chopper 7. Capacitor C3 is connected between a node between switch S3 and reactor L3 and the reference voltage line. Switch S3 is normally turned on, and is turned off, for example, at the time of maintenance of UPS unit 20 or battery 2. Capacitor C3 and reactor L3 constitute a low-pass filter that passes DC power and suppresses leakage of a signal of a carrier frequency generated in bidirectional chopper 7 to a battery 2 side.

Bidirectional chopper 7 supplies the DC power generated by converter 5 to battery 2 in a normal state in which the AC power is supplied from AC power supply 1, and supplies the DC power of battery 2 to inverter 6 at the time of a power failure in which the supply of the AC power from AC power supply 1 is stopped.

Switch S4 is connected between output terminal T3 and fan 23. Switch S4 is normally turned on, and is turned off, for example, at the time of maintenance of UPS unit 20.

The operation of UPS unit 20 will now be briefly described. In a normal state where AC power is supplied from AC power supply 1, the AC power is converted into DC power by converter 5. The DC power is converted into AC power by inverter 6 and the AC power is supplied to load 3, and the DC power is stored in battery 2 by bidirectional chopper 7.

When a power failure occurs and the supply of AC power from AC power supply 1 is stopped, the operation of converter 5 is stopped, and the DC power of battery 2 is supplied to inverter 6 by bidirectional chopper 7 and converted into AC power by inverter 6, and the AC power is supplied to load 3. Therefore, even when the power failure occurs, the operation of load 3 can be continued during a period in which DC power is stored in battery 2.

Bypass unit 30 includes an input terminal T4, an output terminal T5, switches S5 and S6, and fan 33.

Terminals T4 and T5 are connected to terminals T11 and T13, respectively. Switch S5 is connected between terminals T4 and T5. Switch S5 is turned on in the bypass power supply mode and turned off in the inverter power supply mode.

Switch S6 is connected between output terminal T3 and fan 33. Switch S6 is turned on in the bypass power supply mode and turned off in the inverter power supply mode.

As described above, uninterruptible power supply device 100 includes the plurality of UPS units 20 and bypass units 30 connected in parallel between AC power supply 1 and load 3. Therefore, the number of UPS units 20 and bypass units 30 connected in parallel can be adjusted according to the magnitude of load 3, and as a result, uninterruptible power supply device 100 can easily respond to various loads.

In addition, the components constituting uninterruptible power supply device 100 are divided into UPS unit 20, bypass unit 30, and terminal unit 10, whereby the arrangement of the components in housing 110 can be easily changed by changing the arrangement order of the plurality of units in the Z-axis direction. With this configuration, the arrangement of terminals can be easily changed in accordance with the direction of leading wire 140, and thus, it is possible to easily respond to both entry of wire 140 from upper surface 110A of housing 110 and entry of wire 140 from lower surface 110B.

Figure 5:
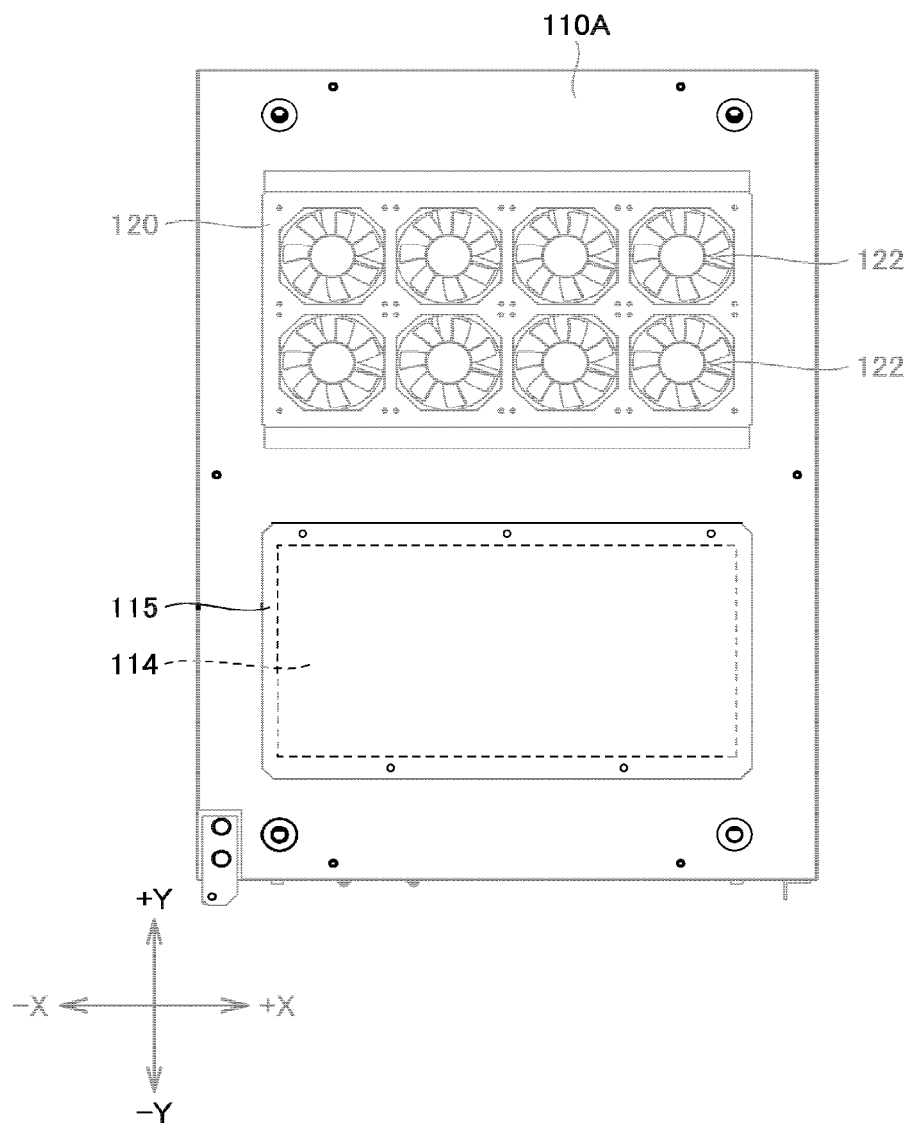
FIG. 5 is a top view of the uninterruptible power supply device illustrated in FIG. 1.

FIG. 5 is a top view of uninterruptible power supply device 100 illustrated in FIG. 1. As illustrated in FIG. 5, fan unit 120 is disposed on upper surface 110A of housing 110, and opening 114 is formed. Opening 114 is covered with lid 115.

Fan unit 120 includes a plurality of fans 122. The plurality of fans 122 is aligned on upper surface 110A. Each fan 122 has the same size as fans 23 and 33 built in UPS units 20 and bypass unit 30. The number of fans 122 can be appropriately changed according to an air blow volume necessary for cooling the plurality of units 20 and 30.

In the example of FIG. 5, opening 114 is disposed on the front surface side, and eight fans 122 are disposed on the rear surface side. Since fan unit 120 includes the plurality of fans 122, it is possible to reduce the restriction on the position of opening 114 on upper surface 110A.

Figure 6:
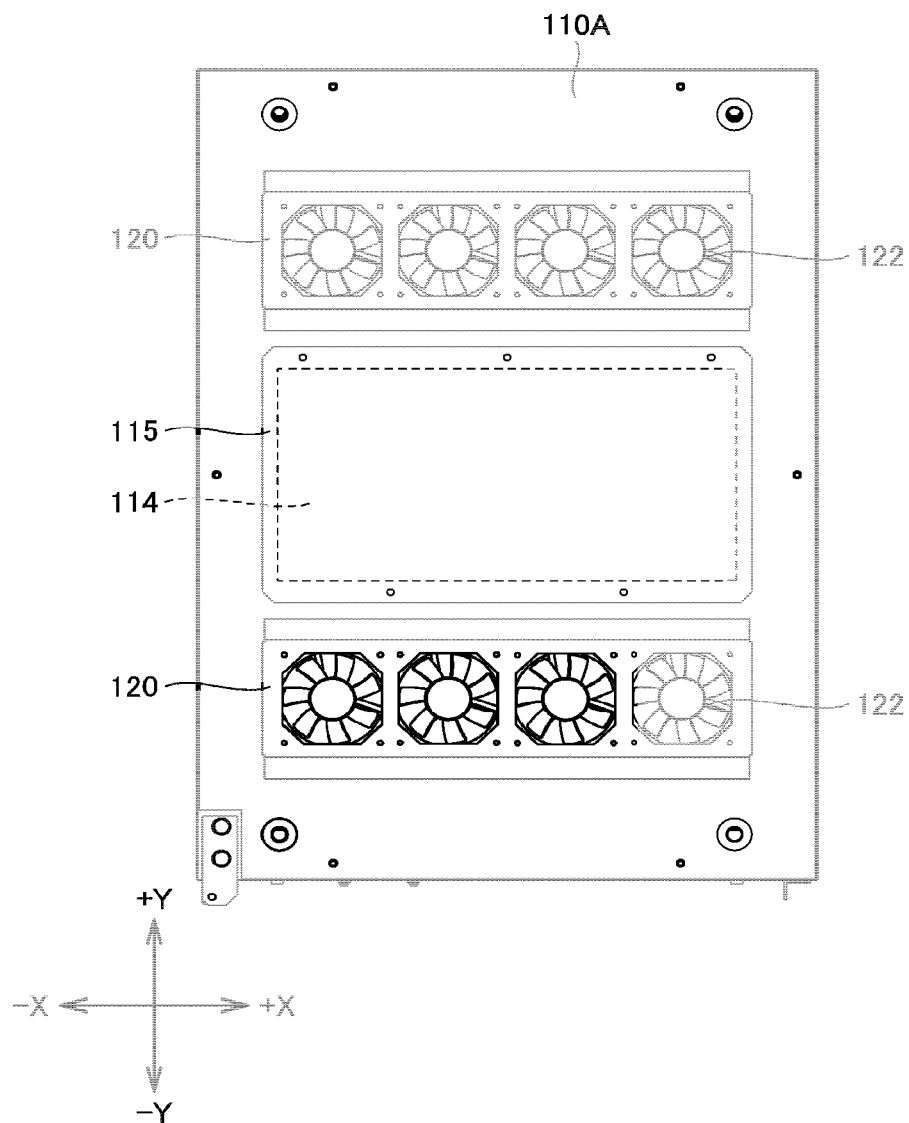
FIG. 6 is a diagram for describing another example of an arrangement of a fan unit and an opening.

FIG. 6 is a diagram for describing another example of arrangement of fan unit 120 and opening 114. FIG. 6 shows a top view of uninterruptible power supply device 100. The number of fans 122 included in fan unit 120 is the same as that in FIG. 5.

In the example of FIG. 6, opening 114 is formed in a central portion of upper surface 110A of housing 110. The fan unit is divided into two fan units 120, and two fan units 120 are respectively disposed on a front surface side and a rear surface side with respect to opening 114. Each fan unit 120 includes four fans 122. The number of fans 122 included in two fan units 120 may not be the same.

Figure 7:
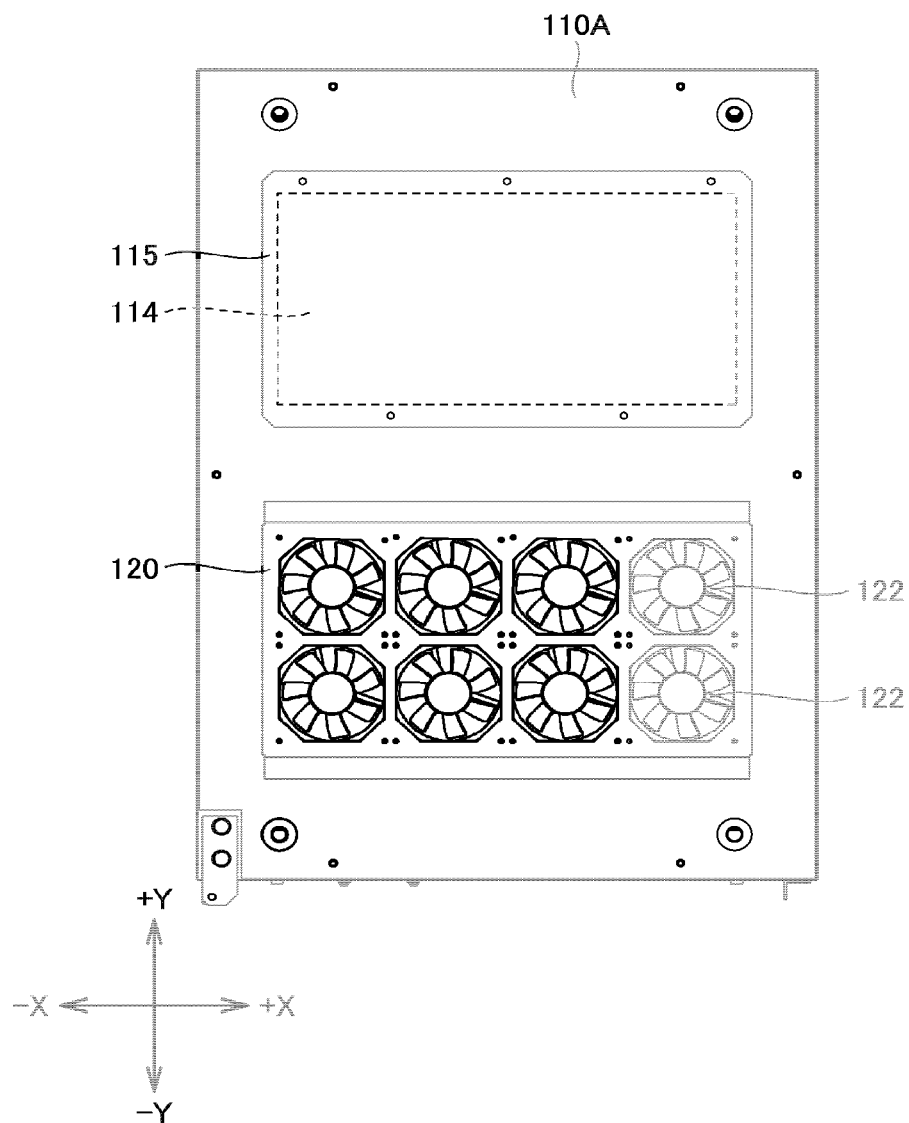
FIG. 7 is a diagram for describing another example of an arrangement of the fan unit and the opening.

FIG. 7 is a diagram for describing another example of arrangement of fan unit 120 and opening 114. FIG. 7 shows a top view of uninterruptible power supply device 100. The number of fans 122 included in fan unit 120 is the same as that in FIG. 5. In the example of FIG. 7, eight fans 122 are disposed on the front surface side, and opening 114 is formed on the rear surface side.

Here, as a comparative example, a case where fan unit 120 includes one large fan will be considered. In this case, a large fan is disposed on upper surface 110A, and opening 114 needs to be formed in a peripheral region of the fan so as to avoid the fan. There is a concern that the formation position of opening 114 is restricted by the position of the fan.

On the other hand, in the present embodiment, fan unit 120 includes the plurality of small fans 122, so that the degree of freedom in the arrangement of fan unit 120 can be increased while an air blow volume necessary for cooling is ensured, as illustrated in FIGS. 5 to 7. This configuration reduces the restriction on the formation position of opening 114, thereby enabling appropriate selection of the formation position of opening 114 according to the installation place of uninterruptible power supply device 100 and the workability of wiring.

Figure 8:
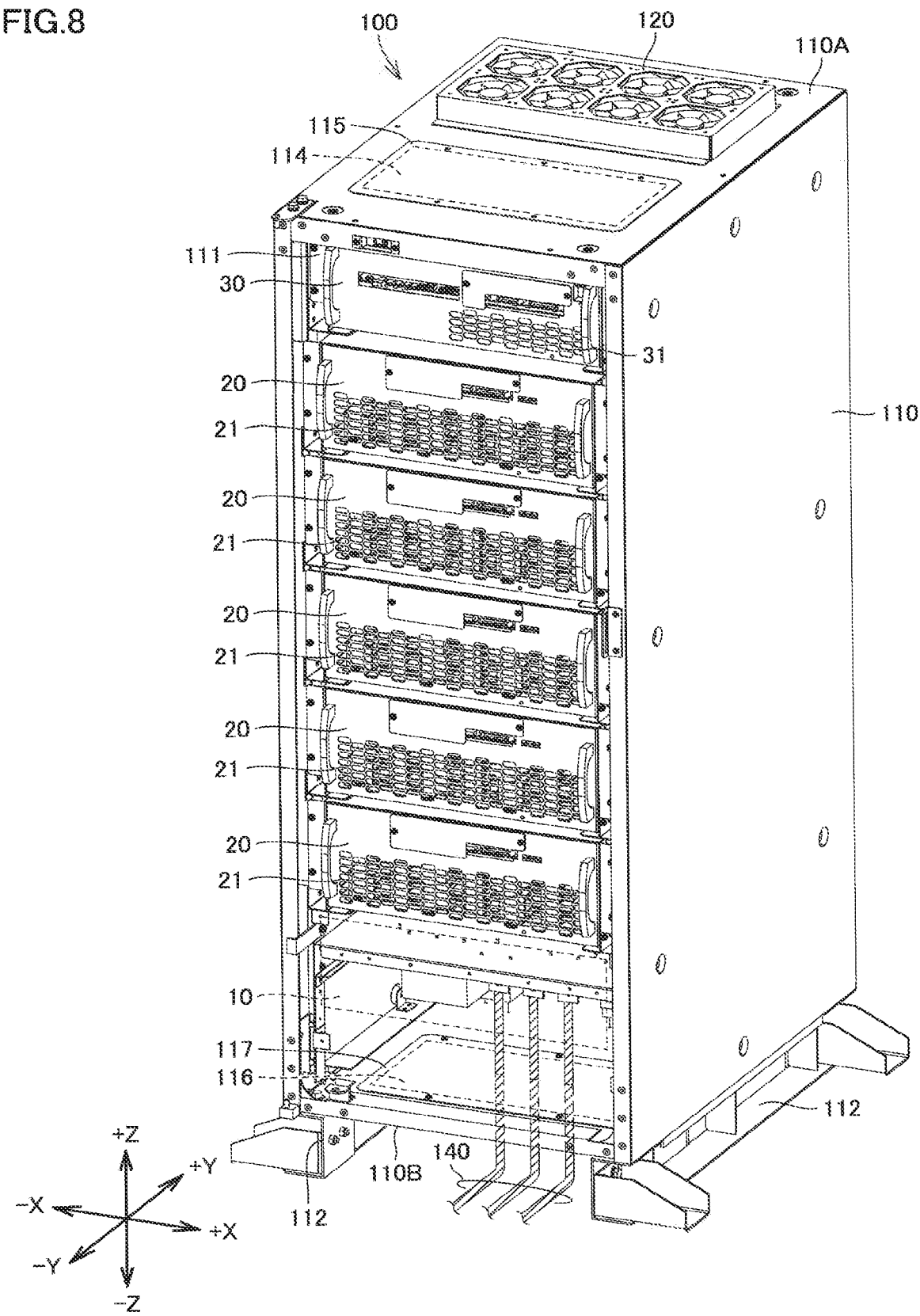
FIG. 8 is a schematic external view illustrating a configuration example of an uninterruptible power supply device according to an embodiment of the present invention.

FIG. 8 is a schematic external view illustrating a configuration example of an uninterruptible power supply device according to the present embodiment. Uninterruptible power supply device 100 in FIG. 8 differs from uninterruptible power supply device 100 in FIG. 1 in the leading direction of wire 140. FIG. 8 illustrates a configuration example in a case where wire 140 is led from lower surface 110B of housing 110. In this case, terminal unit 10 is located at the lowermost stage (the side closest to opening 116) among the plurality of units 10, 20, and 30. Therefore, connection between wire 140 and the terminal can be simplified.

Opening 116 is covered with a lid 117. Wire 140 is led into housing 110 through a through hole formed in lid 117. A first end of wire 140 is connected to the terminal accommodated in terminal unit 10 inside housing 110. Although not illustrated, a second end of wire 140 is connected to AC power supply 1, load 3, battery 2, or the like. Note that, in order to prevent intrusion of dust into housing 110, the through hole is closed by resin or the like in a state where wire 140 penetrates the through hole.

Here, comparing the configuration example of FIG. 1 with the configuration example of FIG. 8, the arrangement order of the plurality of units 10, 20, and 30 in the Z-axis direction inside housing 110 is different. Due to the configuration in which terminal unit 10 is disposed close to the opening serving as an entry port of wire 140, uninterruptible power supply device 100 can be electrically connected to AC power supply 1, battery 2, and load 3 without routing wire 140 inside housing 110.

The conventional device configuration enables a wire to be led from the upper surface and the lower surface of the housing by, for example, providing a wiring space in the side surface of the housing. On the other hand, there is a concern about an increase in size of the device. In contrast, in the present embodiment, the formation of the wiring space is unnecessary, whereby the housing can be simplified and downsized.

It should be understood that the embodiments disclosed herein are illustrative in all respects and not restrictive. The scope of the present invention is defined not by the above description but by the claims, and is intended to include meanings equivalent to the claims and all modifications within the scope.

REFERENCE SIGNS LIST

1: AC power supply, 2: battery, 3: load, 10: terminal unit, 20: UPS unit, 30: bypass unit, 100: uninterruptible power supply device, 110: housing, 110A: upper surface, 110B: lower surface, 112: leg, 111, 114, 116: opening, 115, 117: lid, 120: fan unit, 23, 33, 122: fan, T1, T11: input terminal, T2, T12: battery terminal, T3, T13: output terminal, S1 to S6: switch, L1 to L3: reactor, C1 to C4: capacitor

The invention claimed is:

1. An uninterruptible power supply device comprising:
a housing having a rectangular parallelepiped shape;
a plurality of units vertically stacked and housed in the housing; and
a fan unit including a plurality of fans aligned on an upper surface of the housing,
wherein
each of the upper surface and a lower surface of the housing is formed with an opening through which a wire is led into the housing, wherein
the plurality of units includes:
a plurality of uninterruptible power supply units; and
a terminal unit for connecting the plurality of uninterruptible power supply units in parallel between an alternating-current (AC) power supply and a load, wherein
when the wire is led through the opening located on the upper surface of the housing, the terminal unit is located above the plurality of uninterruptible power supply units, and
the wire is connected to the terminal unit via the opening.

2. The uninterruptible power supply device according to claim 1, wherein
each of the plurality of uninterruptible power supply units includes:
a converter that converts a first AC power supplied from the AC power supply into a direct-current (DC) power; and
an inverter that:
converts the DC power generated by the converter into a second AC power and supplies the second AC power to the load in a normal state in which the AC power supply supplies the first AC power, and
converts the DC power stored in an electrical storage device into the second AC power and supplies the second AC power to the load upon an occurrence of a power failure in which supply of the first AC power from the AC power supply is stopped.

3. The uninterruptible power supply device according to claim 1, wherein
each of the plurality of uninterruptible power supply units has
a front surface and a rear surface that are formed with vents, and
a fan for air intake from the front surface and air discharge from the rear surface.

4. An uninterruptible power supply device comprising:
a housing having a rectangular parallelepiped shape;
a plurality of units vertically stacked and housed in the housing; and
a fan unit including a plurality of fans aligned on an upper surface of the housing, wherein
each of the upper surface and a lower surface of the housing is formed with an opening through which a wire is led into the housing, wherein
the plurality of units includes:
a plurality of uninterruptible power supply units; and
a terminal unit for connecting the plurality of uninterruptible power supply units in parallel between an alternating-current (AC) power supply and a load, wherein
when the wire is led through the opening located on the lower surface of the housing, the terminal unit is located below the plurality of uninterruptible power supply units, and
the wire is connected to the terminal unit via the opening.

5. The uninterruptible power supply device according to claim 4, wherein each of the plurality of uninterruptible power supply units includes:
a converter that converts a first AC power supplied from the AC power supply into a direct-current (DC) power; and
an inverter that:
converts the DC power generated by the converter into a second AC power and supplies the second AC power to the load in a normal state in which the AC power supply supplies the first AC power, and
converts the DC power stored in an electrical storage device into the second AC power and supplies the second AC power to the load upon an occurrence of a power failure in which supply of the first AC power from the AC power supply is stopped.

6. The uninterruptible power supply device according to claim 4, wherein each of the plurality of uninterruptible power supply units has
a front surface and a rear surface that are formed with vents, and
a fan for air intake from the front surface and air discharge from the rear surface.

* * * * *